US009577078B1

(12) United States Patent
Chung et al.

(10) Patent No.: US 9,577,078 B1
(45) Date of Patent: Feb. 21, 2017

(54) STRUCTURE AND FORMATION METHOD OF SEMICONDUCTOR DEVICE STRUCTURE

(71) Applicants: Taiwan Semiconductor Manufacturing Co., Ltd., Hsinchu (TW); National Chiao Tung University, Hsinchu (TW)

(72) Inventors: Steve S. Chung, Hsinchu (TW); E-Ray Hsieh, Kaohsiung (TW); Yu-Bin Zhao, New Taipei (TW); Samuel C. Pan, Hsinchu (TW)

(73) Assignees: Taiwan Semiconductor Manufacturing Co., Ltd., Hsinchu (TW); National Chiao Tung University, Hsinchu (TW)

( * ) Notice: Subject to any disclaimer, the term of this patent is extended or adjusted under 35 U.S.C. 154(b) by 0 days.

(21) Appl. No.: 14/994,718

(22) Filed: Jan. 13, 2016

Related U.S. Application Data

(60) Provisional application No. 62/232,884, filed on Sep. 25, 2015.

(51) Int. Cl.
*H01L 29/78* (2006.01)
*H01L 29/02* (2006.01)
*H01L 21/336* (2006.01)
*H01L 29/66* (2006.01)
*H01L 29/786* (2006.01)

(52) U.S. Cl.
CPC ... *H01L 29/66977* (2013.01); *H01L 29/66742* (2013.01); *H01L 29/78618* (2013.01); *H01L 29/78642* (2013.01); *H01L 29/78696* (2013.01)

(58) Field of Classification Search
CPC ............... H01L 29/66977; H01L 29/66742; H01L 29/78618; H01L 29/78642; H01L 29/78696
USPC ......... 257/329, 328, 410, 413, 192, 105, 29, 257/E29.255, E29.262, E21.41, 257/E21.404, E21.409, E27.062; 438/268, 438/282, 286; 327/420
See application file for complete search history.

(56) References Cited

U.S. PATENT DOCUMENTS

| | | | |
|---|---|---|---|
| 9,306,021 B2 * | 4/2016 | Chung | H01L 29/47 |
| 2003/0122180 A1* | 7/2003 | Sugiyama | H01L 21/28273 257/314 |
| 2013/0093497 A1* | 4/2013 | Lee | H01L 29/78609 327/420 |
| 2013/0230954 A1* | 9/2013 | Loh | H01L 29/66477 438/268 |
| 2014/0061777 A1* | 3/2014 | Kanemura | H01L 29/7827 257/329 |
| 2014/0158989 A1* | 6/2014 | Byun | H01L 29/452 257/29 |
| 2016/0141398 A1* | 5/2016 | Mallik | H01L 29/66356 257/105 |

* cited by examiner

Primary Examiner — Dao H Nguyen
(74) Attorney, Agent, or Firm — Birch, Stewart, Kolasch & Birch, LLP

(57) ABSTRACT

Structures and formation methods of a semiconductor device structure are provided. The semiconductor device structure includes a source structure in a semiconductor substrate. The semiconductor device structure also includes a channel layer over the semiconductor substrate. A first portion of the channel layer covers a portion of the source structure. A second portion of the channel layer laterally extends away from the source structure. The semiconductor device structure further includes a drain structure over the semiconductor substrate. The drain structure and the source structure have different conductivity types. The drain structure adjoins the second portion of the channel layer.

20 Claims, 15 Drawing Sheets

STRUCTURE AND FORMATION METHOD OF SEMICONDUCTOR DEVICE STRUCTURE

CROSS REFERENCE TO RELATED APPLICATIONS

This application claims the benefit of U.S. Provisional Application No. 62/232,884, filed on Sep. 25, 2015, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
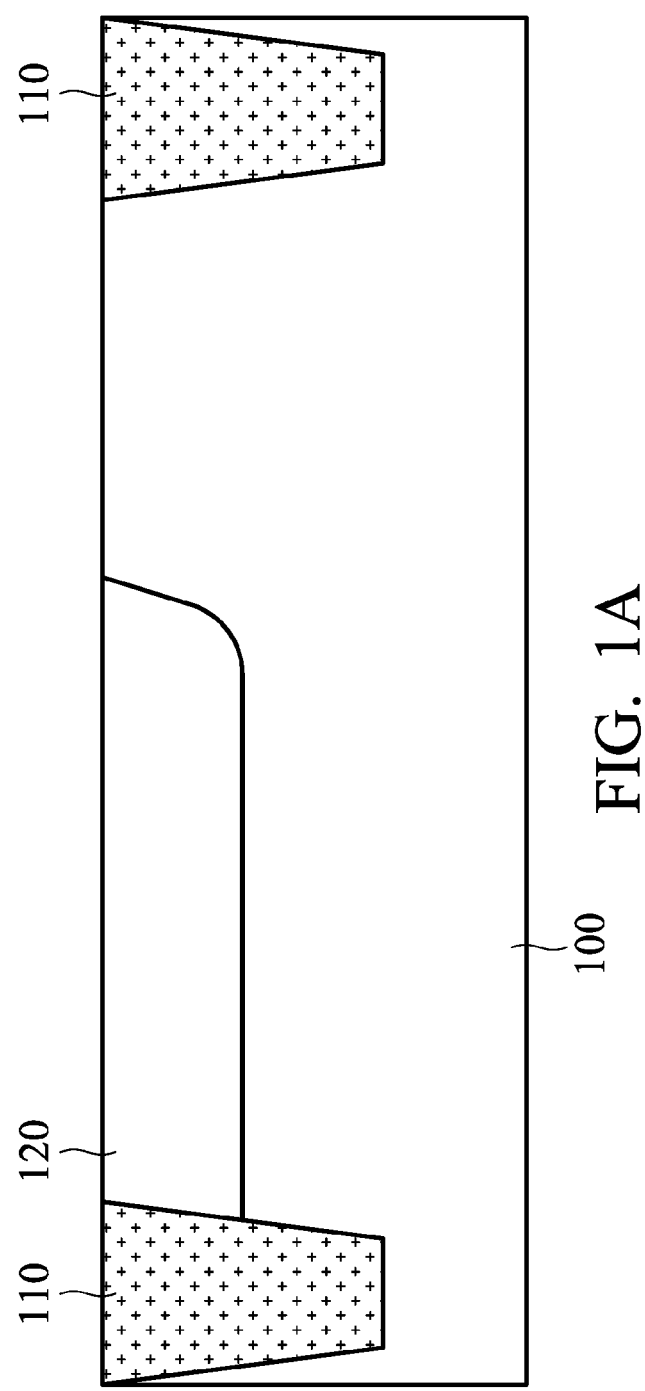
FIGS. 1A-1G are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1G are cross-sectional views of various stages of a process for forming a semiconductor device structure, in accordance with some embodiments. Additional operations can be provided before, during, and/or after the stages described in FIGS. 1A-1G. Some of the stages that are described can be replaced or eliminated for different embodiments. Additional features can be added to the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include silicon germanium, gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated by using a wafer bonding process, a silicon film transfer process, a separation by implantation of oxygen (SIMOX) process, another applicable method, or a combination thereof.

As shown in FIG. 1A, isolation features 110 are formed in the semiconductor substrate 100, in accordance with some embodiments. The isolation features 110 are used to define active regions and electrically isolate various device elements formed in and/or over the semiconductor substrate 100 in the active regions. In some embodiments, the isolation features 110 include shallow trench isolation (STI) features, local oxidation of silicon (LOCOS) features, other suitable isolation features, or a combination thereof.

In some embodiments, each of the isolation features 110 has a multi-layer structure. In some embodiments, the isolation features 110 are made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation features 110.

In some embodiments, multiple recesses (or trenches) are formed in the semiconductor substrate 100. In some embodiments, one or more photolithography and etching processes are used to form the recesses. Afterwards, a dielectric material layer is deposited over the semiconductor substrate 100. The dielectric material layer fills the recesses. In some embodiments, the dielectric material layer is deposited using a chemical vapor deposition (CVD) process, a spin-on process, another applicable process, or a combination thereof. In some embodiments, a planarization process is performed to thin down the dielectric material layer until the top surface of the semiconductor substrate 100 is exposed. The planarization process may include a chemical mechanical polishing (CMP) process, a grinding process, an etching process, another applicable process, or a combination thereof.

As shown in FIG. 1A, one or more source structures 120 are formed in the semiconductor substrate 100, in accordance with some embodiments. In FIG. 1A, only one of the source structures 120 is shown. In some embodiments, the source structures 120 adjoin one or some of the isolation features 110. In some other embodiments, the source structures 120 are not in direct contact with the isolation features 110.

In some embodiments, the source structures 120 are doped with one or more N-type or P-type dopants. For example, the semiconductor substrate 100 includes silicon and the source structures 120 are doped with phosphorus (P), arsenic (As), or another suitable dopant. Alternatively, the semiconductor substrate 100 includes silicon germanium and the source structures 120 are doped with boron (B) or another suitable dopant. In some embodiments, the concentration of the dopant in the source structures 120 is in a range from about $10^{19}$ atoms/cm$^3$ to about $10^{21}$ atoms/cm$^3$.

In some embodiments, one or multiple implantation processes are performed over the semiconductor substrate 100 so as to form the source structures 120. In some embodiments, an implantation mask (not shown) is used to ensure that dopants are implanted into a region where the source structure 120 is designed to form. In some embodiments, after the implantation process(es), a thermal operation is performed to activate the dopants so as to form the source structures 120. For example, a rapid thermal annealing process is performed.

Embodiments of the disclosure are not limited thereto. In some other embodiments, the source structures 120 include epitaxial structures. In some embodiments, the source structures 120 include a P-type or N-type semiconductor material. For example, the source structures 120 may include epitaxially grown silicon, silicon-germanium (SiGe), epitaxially grown phosphorous-doped silicon (SiP), boron-doped silicon germanium (SiGeB) or another suitable epitaxially grown semiconductor material.

In some embodiments, the semiconductor substrate 100 is partially removed to form recesses positioned at locations where the source structures 120 will be formed. In some embodiments, one or more photolithography and etching processes are used to form the recesses. Afterwards, a semiconductor material (or two or more semiconductor materials) is epitaxially grown in the recesses so as to form the source structures 120. In some embodiments, the upper portions of the source structures 120 protrude from the top surface of the semiconductor substrate 100.

In some embodiments, the source structures 120 are formed using a selective epitaxy growth (SEG) process, a CVD process (e.g., a vapor-phase epitaxy (VPE) process, a low pressure CVD (LPCVD) process, and/or an ultra-high vacuum CVD (UHV-CVD) process), a molecular beam epitaxy process, deposition of doped amorphous semiconductor (e.g. Si, Ge or SiGe) followed by a solid-phase epitaxial recrystallization (SPER) step, another applicable process, or a combination thereof. The formation process of the source structures 120 may use gaseous and/or liquid precursors.

In some embodiments, the source structures 120 are doped in-situ during the growth of the source structures 120. In some other embodiments, the source structures 120 are not doped during the growth of the source structures 120. After the epitaxial growth, the source structures 120 are doped in a subsequent process. In some embodiments, the doping is achieved using an ion implantation process, a plasma immersion ion implantation process, a gas and/or solid source diffusion process, another applicable process, or a combination thereof. In some embodiments, the source structures 120 are further exposed to annealing processes to activate the dopants. For example, a rapid thermal annealing process is performed.

Figure 1B:
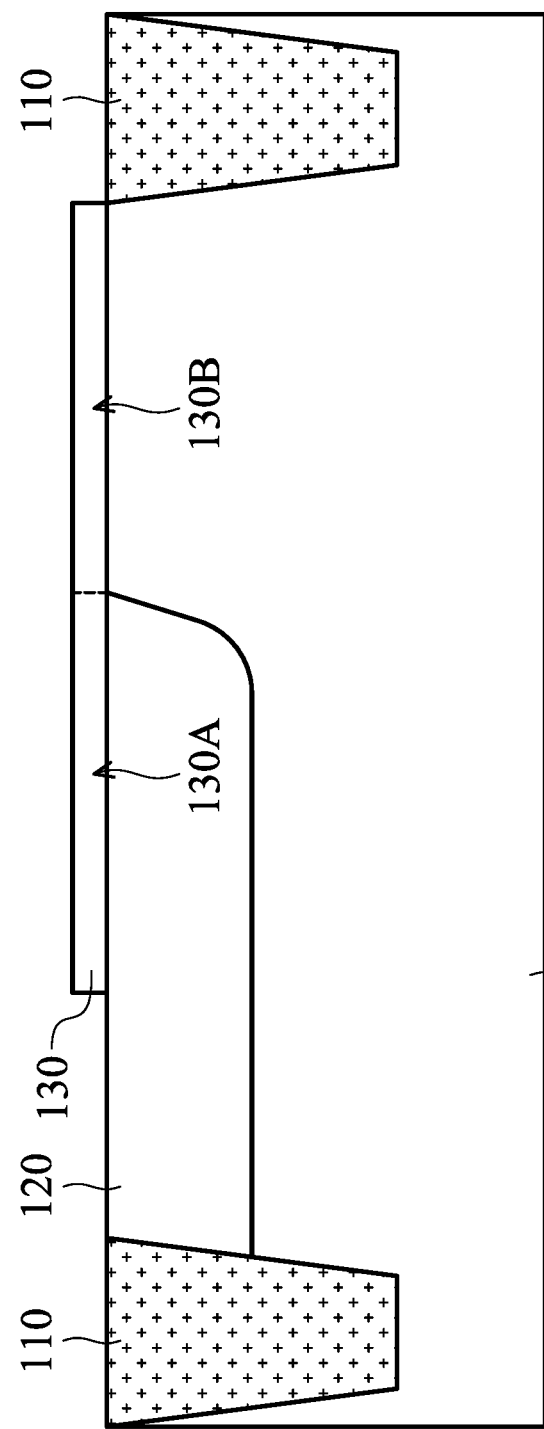

As shown in FIG. 1B, one or more channel layers 130 are formed over the semiconductor substrate 100, in accordance with some embodiments. In some embodiments, each of the source structures 120 is partially covered by one of the channel layers 130. In some embodiments, each of the channel layers 130 has a first portion 130A covering a portion of one of the source structures 120. Each of the channel layers 130 also has a second portion 130B laterally extending away from the source structures 120. In some embodiments, the second portion 130B covers the semiconductor substrate 100. In some embodiments, the thickness of each of the channel layers 130 is in a range from about 5 nm to about 30 nm.

In some embodiments, a patterned mask layer (not shown) is formed over the semiconductor substrate 100. The patterned mask layer is used to assist in the formation of the channel layers 130. The patterned mask layer has openings exposing portions of the source structures 120 and the semiconductor substrate 100 at locations where the channel layers 130 will be formed. The profile of the openings in the patterned mask layer can be fine-tuned to adjust the profile of the subsequently formed channel layers 130. In some embodiments, the patterned mask layer is made of silicon oxide, silicon nitride, another suitable material, or a combination thereof.

For example, a material layer (mask layer) is deposited over the semiconductor substrate 100. Afterwards, a photoresist layer is deposited over the material layer and is patterned by one or more photolithography processes. The patterned photoresist is used as an etching mask to pattern the material layer. Afterwards, one or more etching processes are used to transfer the pattern of the patterned photoresist to the material layer. As a result, the patterned mask layer is formed. The patterned photoresist is subsequently removed. In some other embodiments, a patterned photoresist layer is used directly as the patterned mask layer.

Afterwards, a semiconductor material (or two or more semiconductor materials) is deposited over the semiconductor substrate 100. The deposition of the semiconductor material is selective due to the patterned mask layer. The semiconductor material is deposited over the source structures 120 and the semiconductor substrate 100 exposed by the openings of the patterned mask layer. As a result, the channel layers 130 are formed. The deposition of the semiconductor material may be performed until the semiconductor material is substantially level with, or higher or lower than, the top surface of the patterned mask layer. The patterned mask layer is subsequently removed.

For example, the semiconductor material may include epitaxially grown silicon, epitaxially grown silicon-germanium, or another suitable epitaxially grown semiconductor material. In some embodiments, the channel layers 130 and the source structures 120 include different materials. In some other embodiments, the channel layers 130 and the source structures 120 include the same material. In some embodiments, the semiconductor material is deposited using a SEG process, a CVD process (e.g., a vapor-phase epitaxy (VPE) process, a low pressure CVD (LPCVD) process, and/or an ultra-high vacuum CVD (UHV-CVD) process), a molecular beam epitaxy process, another applicable process, or a combination thereof.

Figure 1C:
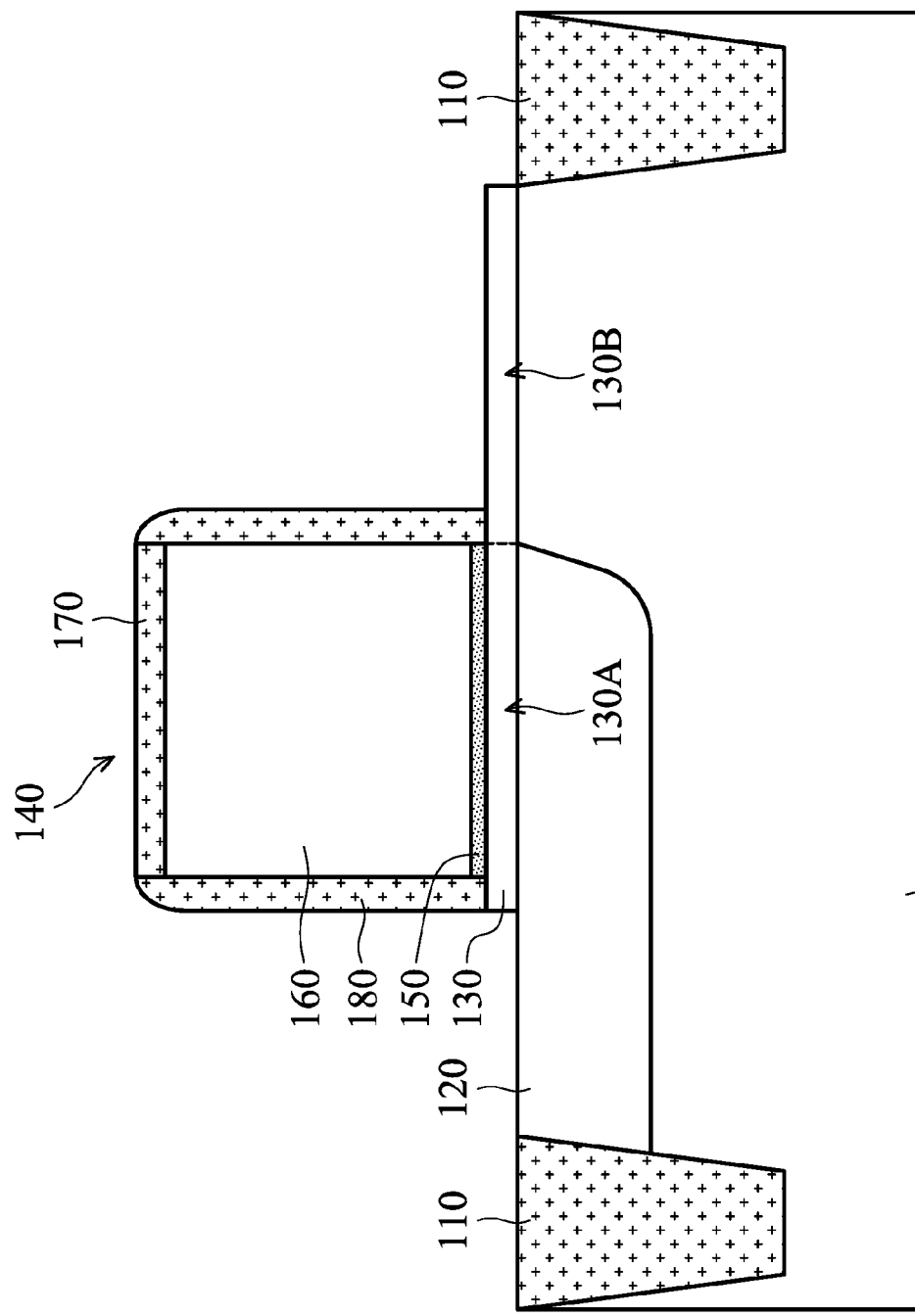

As shown in FIG. 1C, gate stacks including a gate stack 140 are formed over the semiconductor substrate 100, in accordance with some embodiments. In some embodiments, the gate stack 140 covers the first portion 130A of one of the channel layers 130, and the second portion 130B of one of the channel layers 130 is exposed. In some other embodiments, the gate stack 140 partially covers the second portion 130B. In some embodiments, the first portion 130A is sandwiched between the gate stack 140 and one of the source structures 120. In some embodiments, the second portion 130B laterally extending away from the gate stack 140.

In some embodiments, the gate stack 140 includes a gate dielectric layer 150, a gate electrode 160 over the gate dielectric layer 150, and a hard mask 170 over the gate electrode 160. The gate dielectric layer 150 may serve as an etch stop layer during subsequent etching processes.

In some embodiments, the gate dielectric layer 150 is made of silicon oxide, silicon nitride, silicon oxynitride, dielectric material with high dielectric constant (high-K), another suitable dielectric material, or a combination thereof. In some embodiments, the gate dielectric layer 150 is a dummy gate dielectric layer which will be removed in a subsequent gate replacement process. The dummy gate dielectric layer 150 is, for example, a silicon oxide layer. In some embodiments, the gate dielectric layer 150 is conformally deposited over the source structures 120 and the channel layers 130. The gate dielectric layer 150 may be deposited using a CVD process, an atomic layer deposition (ALD) process, a PVD process, a spin-on process, another applicable process, or a combination thereof.

In some embodiments, the gate electrode 160 includes polysilicon, a metal material, another suitable conductive material, or a combination thereof. In some embodiments, the gate electrode 160 is a dummy gate electrode and will be replaced with another conductive material, such as one or more metal materials. The dummy gate electrode 160 is made of, for example, polysilicon.

In some embodiments, the hard mask 170 may serve as an etching mask during the formation of the gate electrode 160. The hard mask 170 may also protect the gate electrode 160 during subsequent processes. In some embodiments, the hard mask 170 is made of silicon nitride, silicon oxynitride, silicon carbide, silicon oxide, silicon carbon nitride, another suitable material, or a combination thereof. In some embodiments, the hard mask 170 has a multi-layer structure. Many variations and modifications can be made to embodiments of the disclosure. In some other embodiments, the hard mask 170 is not formed.

In some embodiments, a gate electrode layer and one or more hard mask layers are deposited over the gate dielectric layer 150. In some embodiments, the gate electrode layer and the hard mask layer are sequentially deposited by using suitable deposition methods. The suitable deposition methods may include a chemical vapor deposition process, an atomic layer deposition process, a thermal oxidation process, a physical vapor deposition process, another applicable process, or a combination thereof. Afterwards, a photolithography process and an etching process are performed to pattern the hard mask layer so as to form the hard mask 170.

With the assistance of the hard mask 170, the gate electrode layer is patterned. As a result, the gate electrode 160 is formed. During the etching process for forming the gate electrode 160, the gate dielectric layer 150 may serve as an etch stop layer to protect the source structures 120 and the channel layers 130. Afterwards, the portions of the gate dielectric layer 150 that are not covered by the gate electrode 160 are removed using, for example, another etching process. As a result, the dielectric layer 150 is patterned, and the gate stack 140 is formed, as shown in FIG. 1C.

Embodiments of the disclosure are not limited thereto. In some other embodiments, the gate stack 140 is not a dummy gate stack and will not be removed. In some embodiments, the gate stack 140 further includes an interfacial layer (IL) below the gate dielectric layer 150. The interfacial layer may be used to form a high-quality interface with a low-density of defects and create a barrier against interfacial reactions and/or diffusion between a dielectric material and a semiconductor material. In some embodiments, the interfacial layer is made of silicon oxide. In some embodiments, the interfacial layer is formed using an ALD process, a thermal oxidation process, another applicable process, or a combination thereof. In some other embodiments, the gate stack 140 does not include the interfacial layer. In some embodiments, the gate dielectric layer 150 is in direct contact with the channel layers 130.

As shown in FIG. 1C, spacer elements 180 are formed over sidewalls of the gate stacks including the gate stack 140, in accordance with some embodiments. In some embodiments, the spacer elements 180 vertically overlap the channel layers 130. In some embodiments, one of the spacer elements 180 covers the first portion 130A of the channel layers 130 and overlaps the source structures 120. In some other embodiments, one of the spacer elements 180 further extends to cover the sidewall of the first portion 130A. In some embodiments, one of the spacer elements 180 covers the second portion 130B of the channel layers 130 without overlapping the source structures 120. In some embodiments, a part of the second portion 130B is sandwiched between one of the spacer elements 180 and the semiconductor substrate 100.

In some embodiments, the spacer elements 180 are made of silicon nitride, silicon oxynitride, silicon carbide, another suitable material, or a combination thereof. In some embodiments, a spacer layer is deposited over the semiconductor substrate 100. The spacer layer may be deposited using a CVD process, a PVD process, a spin-on process, another applicable process, or a combination thereof. Afterwards, an etching process, such as an anisotropic etching process, is performed to partially remove the spacer layer. As a result, the remaining portions of the spacer layer over the sidewalls of the gate stacks form the spacer elements 180.

Figure 1D:
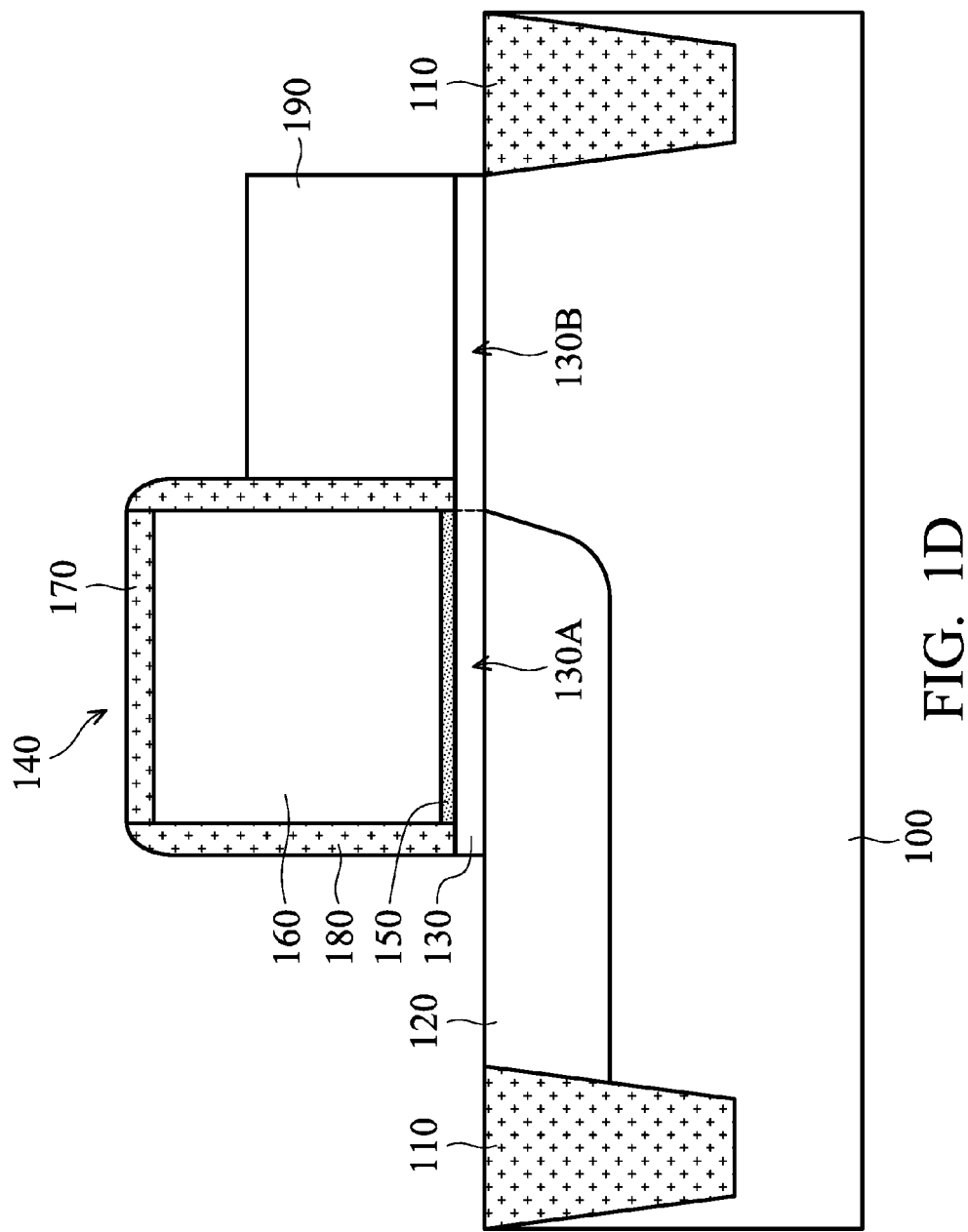

As shown in FIG. 1D, drain structures 190 are formed over the semiconductor substrate 100, in accordance with some embodiments. In some embodiments, each of the drain structures 190 is stacked over one of the channel layers 130. In some embodiments, each of the drain structures 190 adjoins the top surface of the second portion 130B of one of the channel layers 130. In some other embodiments, the drain structure 190 adjoins the sidewall of the second portion 130B. In some embodiments, the second portion 130B is sandwiched between the drain structure 190 and the semiconductor substrate 100. In some embodiments, each of the drain structures 190 is horizontally spaced apart from the first portion 130A of one of the channel layers 130.

In some embodiments, the bottom surface of the drain structures 190 is over the top surface of the source structures 120. In some embodiments, each of the drain structures 190 is horizontally spaced apart from the source structures 120 without overlapping the source structures 120.

In some embodiments, the bottom surface of the gate stack 140 is below the top surface of the drain structures 190. In some embodiments, the drain structures 190 and the gate stacks 140 are spaced over the channel layers 130 side by side. In some embodiments, each of the drain structures 190 is separated from one of the gate stacks (such as the gate stack 140) by one of the spacer elements 180. In some embodiments, one of the spacer elements 180 is sandwiched between one of the drain structures 190 and the gate stack 140. In some embodiments, the drain structures 190 are in direct contact with the spacer elements 180. In some other embodiments, the drain structures 190 are not in direct contact with the spacer elements 180.

In some embodiments, a patterned mask layer (not shown) is formed over the semiconductor substrate 100 to assist in the formation of the drain structures 190. The patterned mask layer has openings exposing portions of the channel layers 130 and/or the semiconductor substrate 100 at locations where the drain structures 190 will be formed. The profile of the openings in the patterned mask layer can be fine-tuned to adjust the profile of the subsequently formed drain structures 190. Afterwards, a semiconductor material (or two or more semiconductor materials) is selectively deposited in the openings of the patterned mask layer. As a result, the drain structures 190 are formed. The deposition of the semiconductor material may be performed until the semiconductor material is substantially level with, or higher or lower than, the top surface of the patterned mask layer. The patterned mask layer is subsequently removed.

In some embodiments, the drain structures 190 include epitaxially grown silicon, epitaxially grown silicon-germanium, epitaxially grown phosphorous-doped silicon, boron-doped silicon germanium or another suitable epitaxially grown semiconductor material. In some embodiments, the drain structures 190 and the channel layers 130 include the same material. In some other embodiments, the drain structures 190 and the channel layers 130 include different materials. In some embodiments, the drain structures 190 and the source structures 120 include different materials. In some other embodiments, the drain structures 190 and the source structures 120 include the same material.

In some embodiments, the drain structures 190 are formed using a SEG process, a CVD process (e.g., a VPE process, a LPCVD process, and/or an UHV-CVD process), a molecular beam epitaxy process, deposition of doped amorphous semiconductor (e.g. Si, Ge or SiGe) followed by a SPER step, another applicable process, or a combination thereof. The formation process of the drain structures 190 may use gaseous and/or liquid precursors.

In some embodiments, the drain structures 190 are doped with one or more N-type or P-type dopants. For example, the drain structures 190 are doped with P, As, Sb, or another suitable dopant. Alternatively, the drain structures 190 are doped with B or another suitable dopant. In some embodiments, the concentration of the dopant in the drain structures 190 is in a range from about $10^{19}$ atoms/cm$^3$ to about $10^{21}$ atoms/cm$^3$. In some embodiments, multiple implantation processes are performed to dope the drain structures 190.

In some embodiments, the dopants in the drain structures 190 and the source structures 120 are different types. In some embodiments, the drain structures 190 are doped with P-type dopants while the source structures 120 are doped with N-type dopants. Therefore, one or more P-type tunneling field-effect transistors (TFETs) will be fabricated. In some other embodiments, the drain structures 190 are doped with N-type dopants while the source structures 120 are doped with P-type dopants. Therefore, one or more N-type TFETs will be fabricated.

In some embodiments, the drain structures 190 are doped in-situ during the growth of the drain structures 190. In some other embodiments, the drain structures 190 are not doped during the growth of the drain structures 190. After the epitaxial growth, the drain structures 190 are doped in a subsequent process. In some embodiments, the doping is achieved using an ion implantation process, a plasma immersion ion implantation process, a gas and/or solid source diffusion process, another applicable process, or a combination thereof. In some embodiments, the drain structures 190 are further exposed to annealing processes to activate the dopants. For example, a rapid thermal annealing process is performed.

Figure 1E:
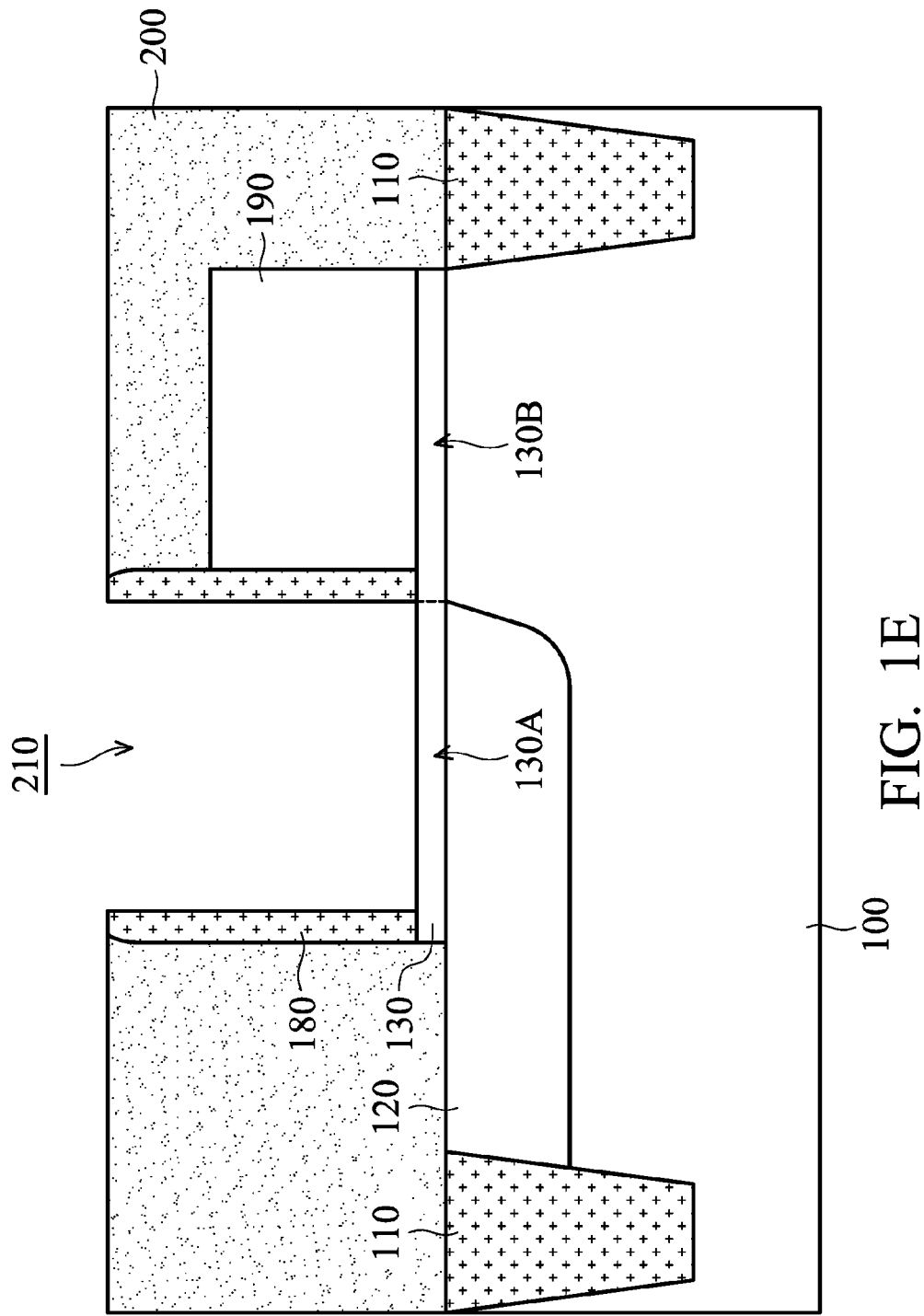

As shown in FIG. 1E, a dielectric layer 200 is deposited over the semiconductor substrate 100, in accordance with some embodiments. The dielectric layer 200 serves as an interlayer dielectric layer. In some embodiments, the dielectric layer 200 is made of silicon oxide, silicon oxynitride, borosilicate glass (BSG), phosphosilicate glass (PSG), borophosphosilicate glass (BPSG), fluorinated silicate glass (FSG), low-K material, porous dielectric material, another suitable dielectric material, or a combination thereof.

In some embodiments, the dielectric layer 200 is deposited using a CVD process, a spin-on process, an ALD process, a PVD process, another applicable process, or a combination thereof. In some embodiments, the dielectric layer 200 covers and surrounds the channel layers 130, the gate stacks including the gate stack 140, the spacer elements 180 and the drain structures 190. Afterwards, the dielectric layer 200 is thinned down until the gate electrode 160 is exposed. In some embodiments, a planarization process is performed to thin down the dielectric layer 200. The planarization process may include a CMP process, a grinding process, an etching process, another applicable process, or a combination thereof. In some embodiments, the hard mask 170 and the upper portions of the spacer elements 180 are removed during the planarization process.

As shown in FIG. 1E, the dummy gate stack 140 is removed, in accordance with some embodiments. As a result, trenches 210 are formed over the semiconductor substrate 100. In some embodiments, the trenches 210 partially expose the first portion 130A of the channel layers 130 that were previously covered by the gate dielectric layer 150 and gate electrode 160. In some other embodiments, the trenches 210 partially expose the first portion 130A and the second portion 130B of the channel layers 130. In some embodiments, the dummy gate stack 140 is removed using a wet etching process, a dry etching process, another applicable process, or a combination thereof.

Figure 1F:
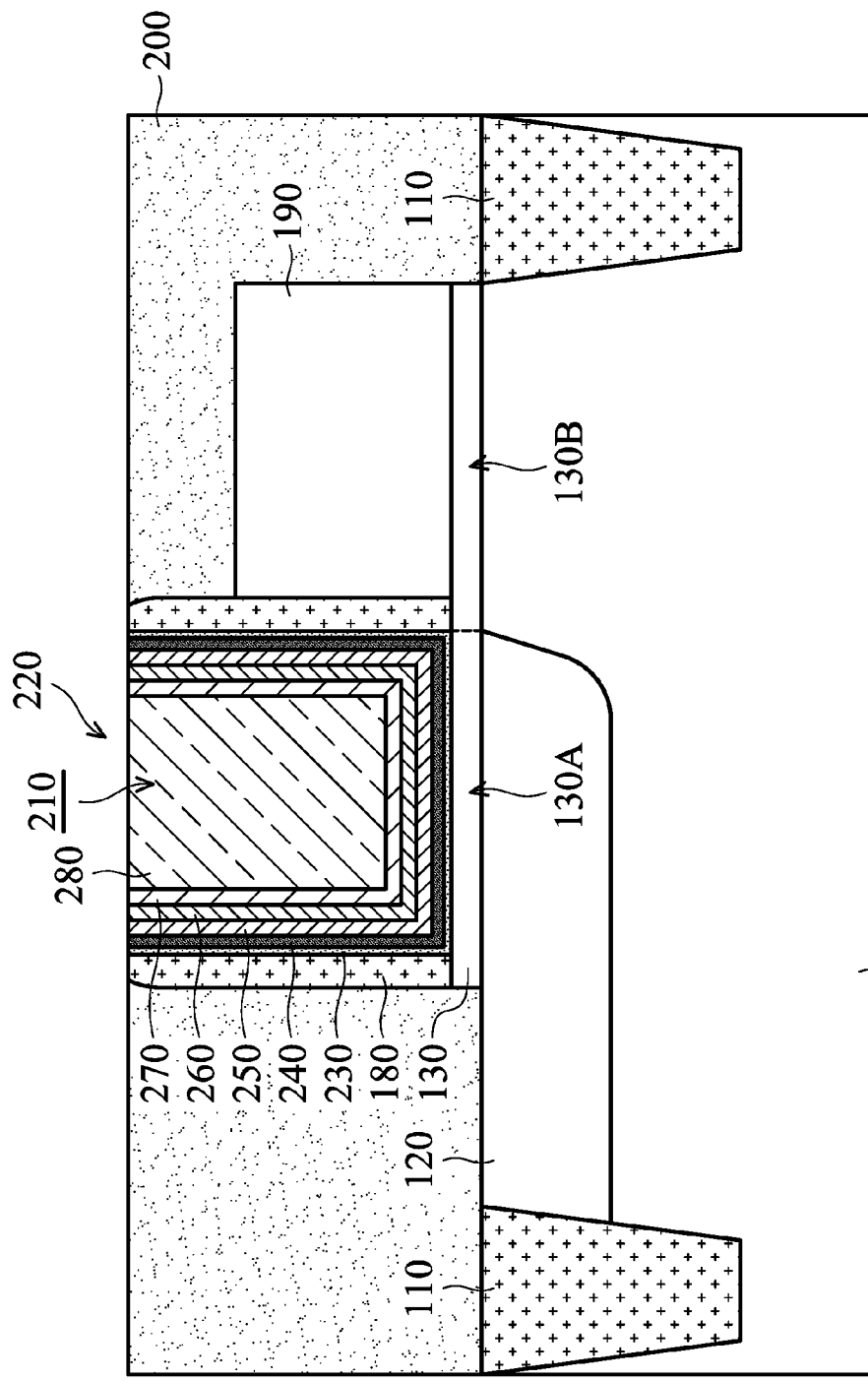

As shown in FIG. 1F, gate stacks including a gate stack 220 are formed in the trenches 210, in accordance with some embodiments. The trenches 210 are filled with the gate stacks. In some embodiments, a margin of the source structures 120 extends across one sidewall of the gate stack 220 towards another sidewall of the gate stack 220. In some embodiments, a margin of the source structures 120 extends across one sidewall of the gate stack 220 and is substantially aligned with another sidewall of the gate stack 220. In some other embodiments, a margin of the source structures 120 extends across one sidewall of the gate stack 220 and is misaligned with another sidewall of the gate stack 220.

In some embodiments, the gate stack 220 includes an interfacial layer 230, a gate dielectric layer 240, and a metal gate stack structure. As shown in FIG. 1F, the interfacial layer 230 is deposited over the sidewalls and the bottoms of the trenches 210, in accordance with some embodiments. In some embodiments, the interfacial layer 230 is made of silicon oxide. In some embodiments, the interfacial layer 230 is made of germanium oxide. In some other embodiments, the interfacial layer 230 is made of silicon germanium oxide or another suitable material. In some embodiments, the interfacial layer 230 is formed using an ALD process, a thermal oxidation process, another applicable process, or a combination thereof. In some other embodiments, the gate stack 220 does not include the interfacial layer 230. In some embodiments, the channel layers 130 are in direct contact with the gate dielectric layer 240.

As shown in FIG. 1F, the gate dielectric layer 240 is deposited over the interfacial layer 230, in accordance with some embodiments. In some embodiments, the gate dielectric layer 240 conformally extends over the sidewalls and the bottoms of the trenches 210. In some embodiments, the gate dielectric layer 240 is a high-K dielectric layer. The high-K dielectric layer may be made of hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

In some embodiments, the gate dielectric layer 240 is deposited using an ALD process, a CVD process, a spin-on process, another applicable process, or a combination thereof. In some embodiments, a high-temperature annealing operation is performed to reduce or eliminate defects in the gate dielectric layer 240.

The metal gate stack structure is deposited over the gate dielectric layer 240. In some embodiments, the metal gate stack structure includes multiple metal gate stacking layers. In some embodiments, the metal gate stacking layers include a barrier layer 250, a work function layer 260, a blocking layer 270, and a metal filling layer 280. Some of these metal gate stacking layers can be replaced or eliminated for different embodiments. Additional layers can be added into the metal gate stack structure.

As shown in FIG. 1F, the barrier layer 250 is deposited over the gate dielectric layer 240, in accordance with some embodiments. The barrier layer 250 may be used to allow the gate dielectric layer 240 to interface with the subsequently formed work function layer 260. The barrier layer 250 may also be used to prevent diffusion between the gate dielectric layer 240 and the subsequently formed work function layer 260. In some embodiments, the barrier layer 250 conformally extends over the sidewalls and the bottoms of the trenches 210.

In some embodiments, the barrier layer 250 is made of a metal-containing material. The metallic material may include titanium nitride, tantalum nitride, another suitable material, or a combination thereof. In some embodiments, the barrier layer 250 includes multiple layers. In some embodiments, the barrier layer 250 is deposited using an ALD process, a PVD process, an electroplating process, an electroless plating process, a CVD process, another applicable process, or a combination thereof. In some other embodiments, the barrier layer 250 is not formed.

As shown in FIG. 1F, the work function layer 260 is formed over the barrier layer 250, in accordance with some embodiments. The work function layer 260 is used to provide the desired work function for transistors to enhance device performance including improved threshold voltage. In some embodiments, the work function layer 260 conformally extends over the sidewalls and the bottoms of the trenches 210.

In the embodiments of forming an N-type TFET, the work function layer 260 can be an N-type metal layer. The N-type metal layer may include metal, metal carbide, metal nitride, or a combination thereof. For example, the N-type metal layer includes titanium nitride, tantalum, tantalum nitride, another suitable material, or a combination thereof.

On the other hand, in the embodiments of forming a P-type TFET, the work function layer 260 can be a P-type metal layer. The P-type metal layer may include metal, metal carbide, metal nitride, other suitable materials, or a combination thereof. For example, the P-type metal includes tantalum nitride, tungsten nitride, titanium, titanium nitride, other suitable materials, or a combination thereof.

The work function layer 260 may also be made of hafnium, zirconium, titanium, tantalum, aluminum, metal carbides (e.g., hafnium carbide, zirconium carbide, titanium carbide, aluminum carbide), metal nitrides, ruthenium, palladium, platinum, cobalt, nickel, conductive metal oxides, or a combinations thereof. The thickness and/or the composition of the work function layer 260 may be fine-tuned to adjust the work function level. For example, a titanium nitride layer may be used as a P-type metal layer or an N-type metal layer, depending on the thickness and/or the composition of the titanium nitride layer.

As shown in FIG. 1F, the blocking layer 270 is deposited over the work function layer 260, in accordance with some embodiments. The blocking layer 270 may be used to prevent the subsequently formed metal filling layer 280 from diffusing or penetrating into the work function layer 260. In some embodiments, the blocking layer 270 conformally extends over the sidewalls and the bottoms of the trenches 210.

In some embodiments, the blocking layer 270 is made of tantalum nitride, titanium nitride, another suitable material, or a combination thereof. In some embodiments, the blocking layer 270 is deposited using an ALD process, a PVD process, an electroplating process, an electroless plating process, another applicable process, or a combination thereof. In some other embodiments, the blocking layer 270 is not formed.

As shown in FIG. 1F, the metal filling layer 280 is deposited over the blocking layer 270 to fill the trenches 210, in accordance with some embodiments. In some embodiments, the metal filling layer 280 is made of tungsten, aluminum, copper, cobalt, another suitable material, or a combination thereof. In some embodiments, the metal filling layer 280 is deposited using a PVD process, a CVD process, an electroplating process, an electroless plating process, another applicable process, or a combination thereof. In some other embodiments, the metal filling layer 280 is not formed.

In some embodiments, the interfacial layer 230, the gate dielectric layer 240 and the metal gate stacking layers together fill the trenches 210. In some embodiments, the portions of the interfacial layer 230, the gate dielectric layer 240 and the metal gate stacking layers outside of the trenches 210 cover the dielectric layer 200. Afterwards, the portions of the interfacial layer 230, the gate dielectric layer 240 and the metal gate stacking layers outside of the trenches 210 are removed. As a result, the metal gate stacking layers remaining in the trenches 210 together form the metal gate stack structure. The interfacial layer 230, the gate dielectric layer 240 and the metal gate stack structure remaining in the trenches 210 together form the gate stack 220. For example, a planarization process is used to partially remove the interfacial layer 230, the gate dielectric layer 240 and the metal gate stacking layers outside of the trenches 210. The planarization process may include a CMP process, a grinding process, an etching process, another applicable process, or a combination thereof.

Figure 1G:
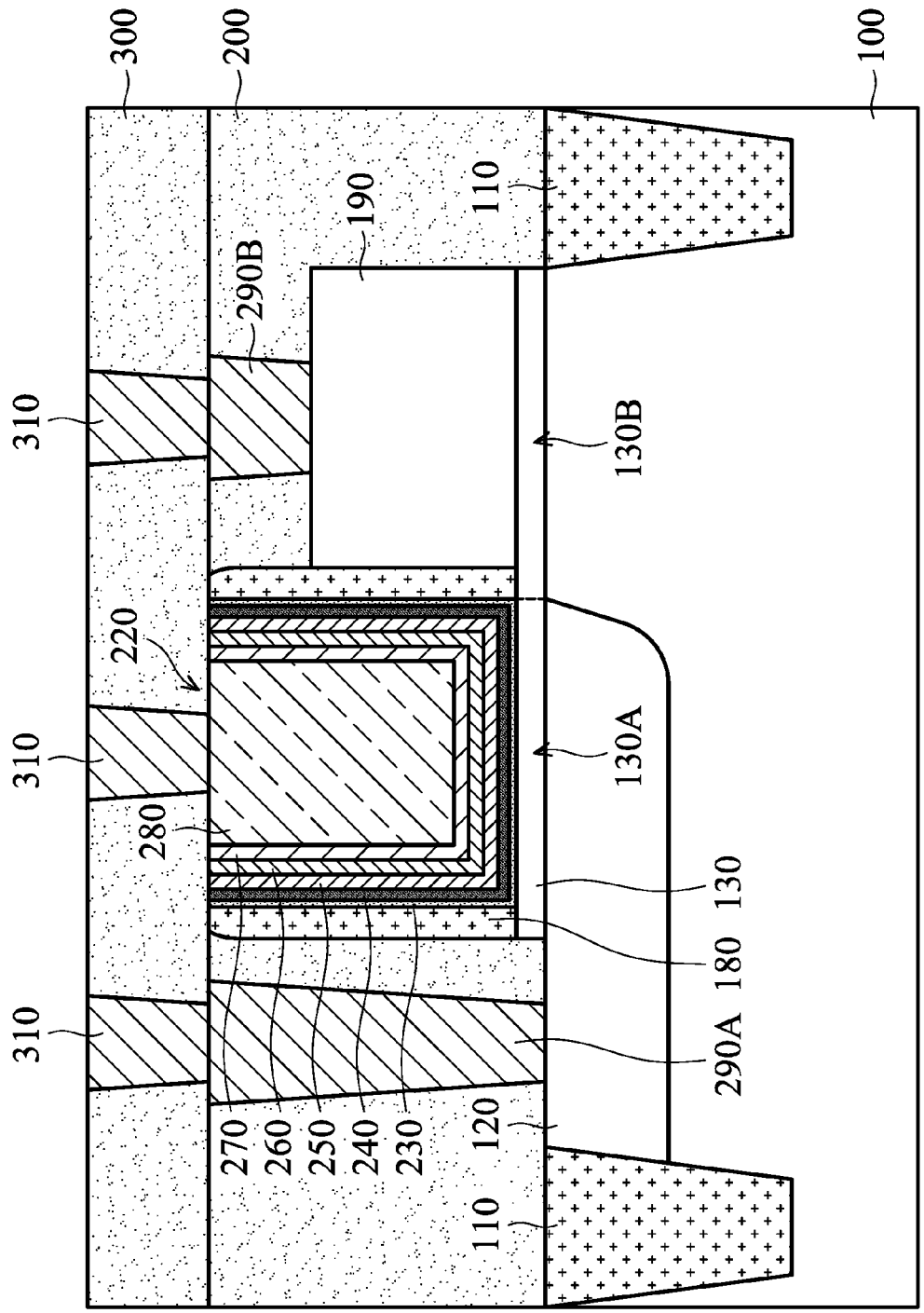

In accordance with some embodiments, conductive contacts are formed to electrically connect to conductive features in/over the semiconductor substrate 100. As shown in FIG. 1G, conductive contacts 290A and 290B are formed to be respectively electrically connected to the source structures 120 and the drain structures 190, in accordance with some embodiments. Since the source structures 120 are formed in the semiconductor substrate 100 and the drain structures 190 are formed over the semiconductor substrate 100, the conductive contacts 290A and 290B have different heights, in accordance with some embodiments. In some embodiments, the conductive contacts 290A are taller than the conductive contacts 290B. In some embodiments, a portion of the drain structures 190 is sandwiched between the conductive contacts 290B and the channel layers 130.

In some embodiments, the dielectric layer 200 is patterned to form contact openings that expose the conductive features such as the source structures 120 and the drain structures 190. Afterwards, a conductive material layer is deposited over the dielectric layer 200 to fill the contact openings. A planarization process is subsequently used to remove the portions of the conductive material layer outside of the contact openings. As a result, the remaining portions of the conductive material layer in the contact openings form the conductive contacts 290A and 290B.

In some embodiments, the conductive material layer is made of tungsten, aluminum, copper, gold, platinum, titanium, another suitable material, or a combination thereof. In some embodiments, the conductive material layer is deposited using a CVD process, a PVD process, an electroplating process, an electroless plating process, another applicable process, or a combination thereof.

As shown in FIG. 1G, a dielectric layer 300 and conductive contacts 310 are formed over the dielectric layer 200, in accordance with some embodiments. The conductive contacts 310 are in the dielectric layer 300. In some embodiments, the conductive contacts 310 are electrically connected to the gate stack 220 and the conductive contacts 290A and 290B.

In some embodiments, the conductive contacts 310 connected to the gate stack 220 overlap the first portion 130A of the channel layers 130 and the source structures 120. In some embodiments, the conductive contacts 310 connected to the conductive contacts 290B overlap the second portion 130B of the channel layers 130 and the drain structures 190. The materials and/or formation methods of the dielectric layer 300 and the conductive contacts 310 are respectively similar to those of the dielectric layer 200 and the conductive contacts 290A and 290B, and therefore are not repeated.

Figure 2:
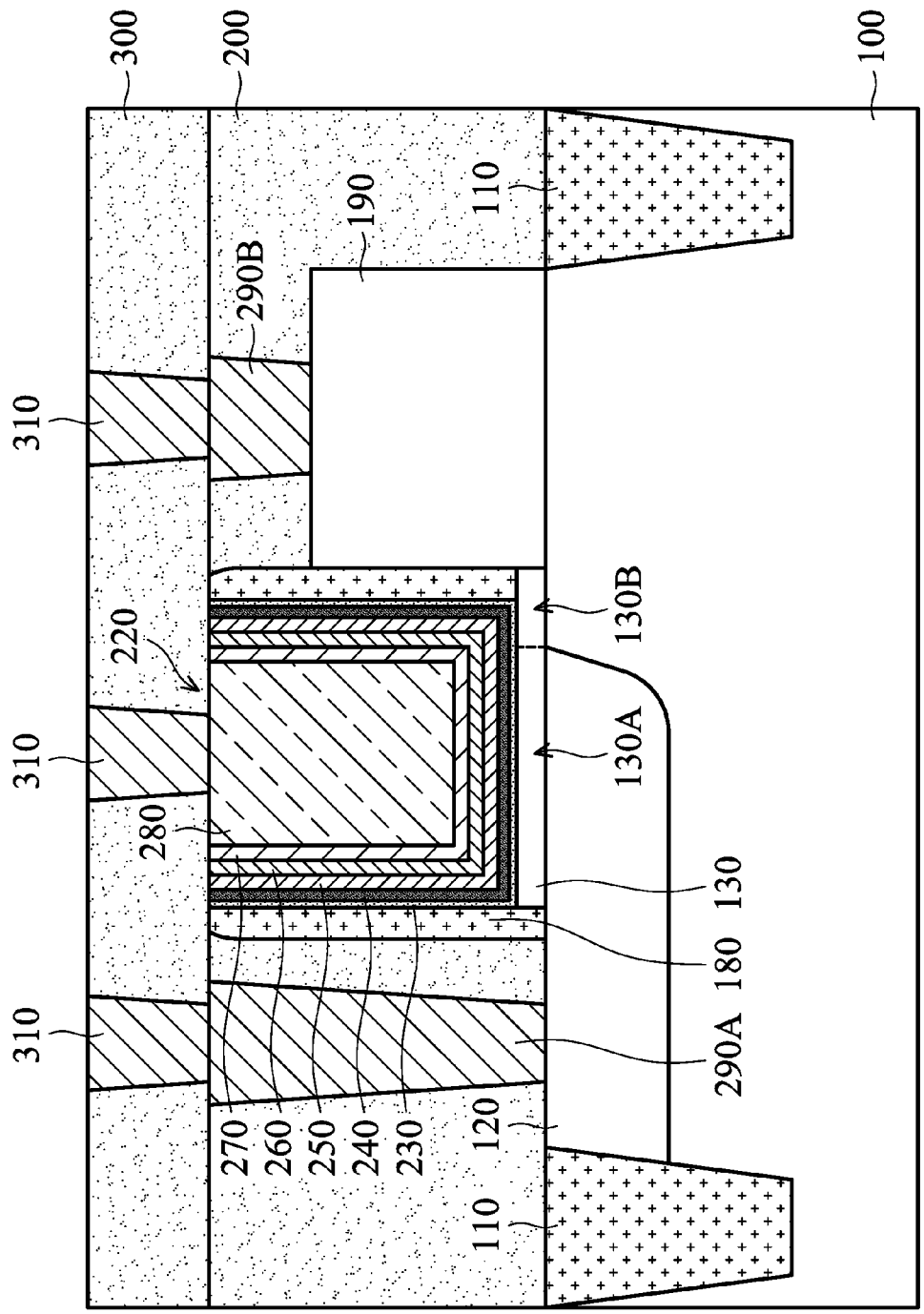
FIG. 2 is a cross-sectional view of a semiconductor device structure, in accordance with some embodiments.

Many variations and/or modifications can be made to embodiments of the disclosure. For example, the drain structures 190 over the semiconductor substrate 100 are not limited to be separated from the semiconductor substrate 100. FIG. 2 is a cross-sectional view of a semiconductor device structure, in accordance with some embodiments. The materials and/or formation methods of the semiconductor device structure are illustrated in the embodiments mentioned above, and are not repeated.

As shown in FIG. 2, the drain structures 190 over the semiconductor substrate 100 are in direct contact with the semiconductor substrate 100, in accordance with some embodiments. For example, a patterned mask layer used to assist in the formation of the drain structures 190 has openings exposing portions of the semiconductor substrate 100. Afterwards, a semiconductor material (or two or more semiconductor materials) is selectively deposited on the semiconductor substrate 100 exposed by the openings of the patterned mask layer. As a result, the drain structures 190 are formed. The patterned mask layer is subsequently removed.

As shown in FIG. 2, one of the drain structures 190 adjoins the sidewall of the second portion 130B of one of the channel layers 130, in accordance with some embodiments. In some embodiments, each of the drain structures 190 is in direct contact with one of the spacer elements 180. In some other embodiments, the drain structures 190 are not in direct contact with the spacer elements 180. In some embodiments, one of the spacer elements 180 covers the sidewall of the first portion 130A of the channel layers 130. In some other embodiments, the spacer elements 180 are over the first portion 130A without extending to the sidewall of the first portion 130A. In some embodiments, a part of the second portion 130B is sandwiched between one of the spacer elements 180 and the semiconductor substrate 100. In some embodiments, another part of the second portion 130B is sandwiched between the gate stack 220 and the semiconductor substrate 100.

As shown in FIG. 2, a margin of the source structures 120 extends across one sidewall of the gate stack 220 towards another sidewall of the gate stack 220, in accordance with some embodiments. In some embodiments, a margin of the source structures 120 extends across one sidewall of the gate stack 220 and is misaligned with another sidewall of the gate stack 220. In some other embodiments, a margin of the source structures 120 extends across one sidewall of the gate stack 220 and is substantially aligned with another sidewall of the gate stack 220.

According to some embodiments of the disclosure, the source structures 120 extend below the channel layers 130 and the gate stack 220 so that the overlapping area between the source structures 120 and the gate stack 220 is increased. As a result, driving/tunneling current ($I_{on}$) is significantly enhanced. Therefore, the device performance of TFETs is greatly improved. Furthermore, the drain structures 190 are raised and lifted over the semiconductor substrate 100, rather than being formed in the semiconductor substrate 100. The raised drain structures 190 further adjoin the second portion 130B of the channel layers 130 so that the drain structures 190 are horizontally spaced apart from the source structures 120 extending below the channel layers 130 and the gate stack 220. As a result, the distance from the source structures 120 to the drain structures 190 is elongated. Therefore, current leakage between the source structures 120 and the drain structures 190 is significantly reduced or mitigated.

In accordance with some embodiments, one of the spacer elements 180 is between one of the drain structures 190 and one of the gate stacks 220. The spacer elements 180 overlap the channel layers 130 so that a channel barrier is created in the channel layers 130 below the spacer elements 180. As a result, the channel barrier and the spacer elements 180 weaken capacitance coupling effect between the drain structures 190 and the gate stack 220. Accordingly, gate-to-drain capacitance ($C_{gd}$) of TFETs is greatly reduced or eliminated. Also, source-to-drain leakage current can be prevented due to the channel barrier. Therefore, sub-threshold swing (S.S.) value of TFETs is lowered even further.

Embodiments of the disclosure can be applied to not only a semiconductor device structure with P-type or N-type TFETs but also a semiconductor device structure with complementary TFETs (CTFETs). FIGS. 3A-3G are cross-sectional views of various stages of a process for forming a semiconductor device structure, in accordance with some embodiments. Additional operations can be provided before, during, and/or after the stages described in FIGS. 3A-3G. Some of the stages that are described can be replaced or eliminated for different embodiments. In some embodiments, the materials and/or formation methods of a semiconductor device structure with CTFETs are similar to those of the described semiconductor device structure with P-type or N-type TFETs, and therefore are not repeated.

Figure 3A:
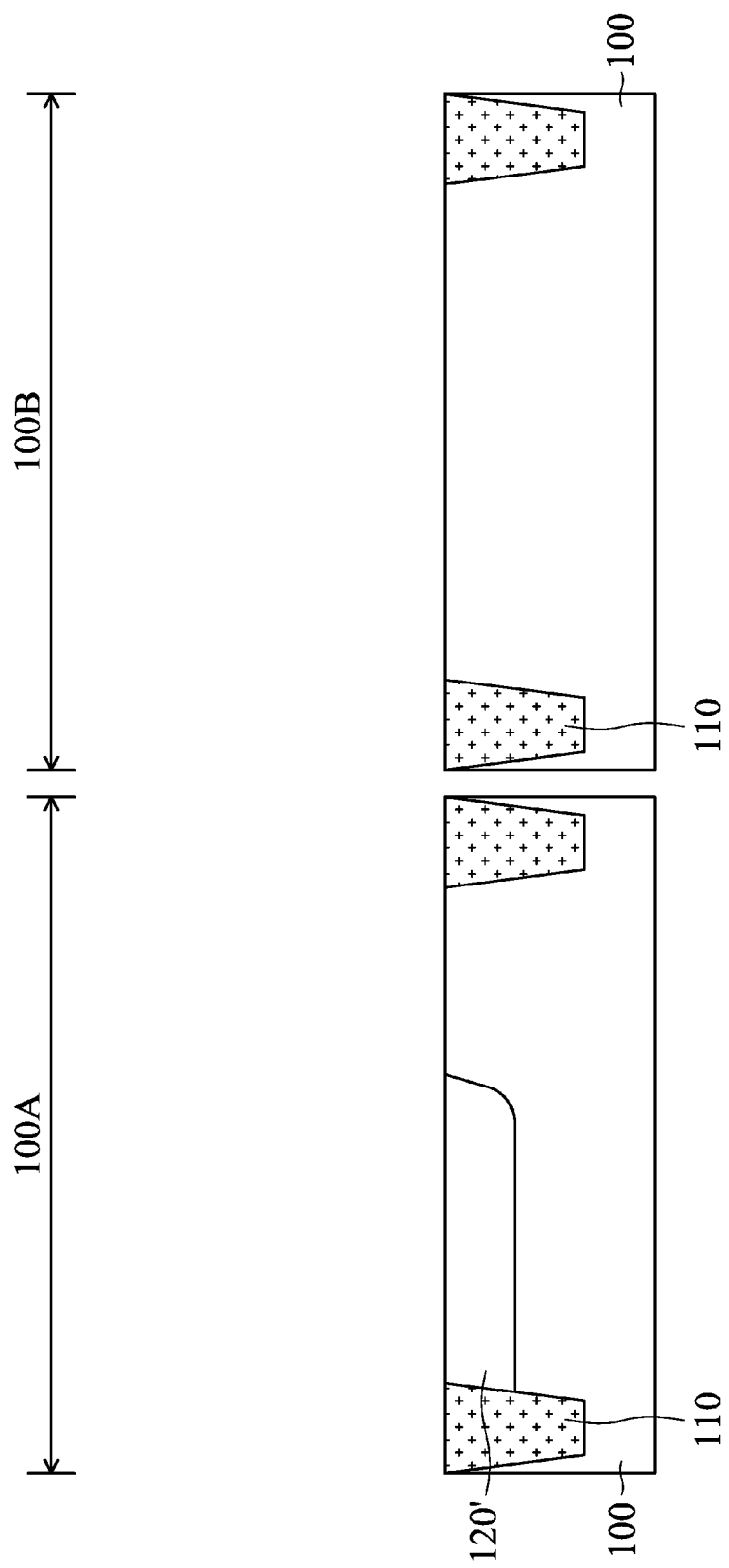
FIGS. 3A-3G are cross-sectional views of various stages of a process for forming a semiconductor device structure, in accordance with some embodiments.

As shown in FIG. 3A, a semiconductor device structure similar to that shown in FIG. 1A is provided. The semiconductor substrate 100 is divided into multiple regions including regions 100A and 100B. In some embodiments, P-type TFETs are configured to be formed in the regions 100A, and N-type TFETs are configured to be formed in the regions 100B. In some other embodiments, N-type TFETs are configured to be formed in the regions 100A, and P-type TFETs are configured to be formed in the regions 100B.

As shown in FIG. 3A, similar to the embodiments illustrated in FIG. 1A, source structures 120' are formed in the semiconductor substrate 100 in the regions 100A, in accordance with some embodiments. In some embodiments, the source structures 120' are doped with one or more N-type or P-type dopants. In some embodiments, an implantation mask (not shown) is used to ensure that the semiconductor substrate 100 in the regions 100A is doped to form the source structures 120 while the semiconductor substrate 100 in the regions 100B is not doped. For example, the implantation mask has openings exposing portions of the regions 100A without exposing the regions 100B.

Figure 3B:
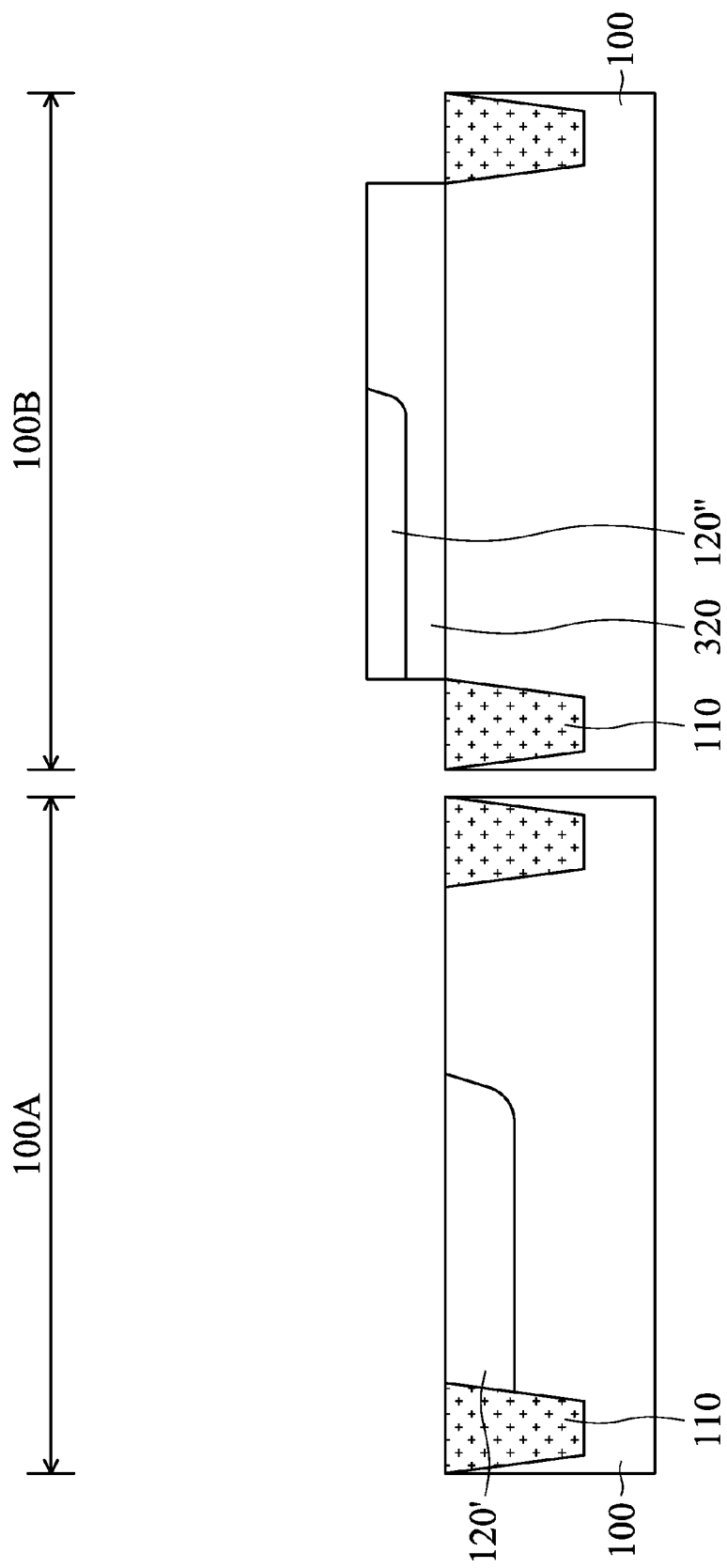

As shown in FIG. 3B, a semiconductor material layer 320 is formed over the semiconductor substrate 100 in each of the regions 100B, in accordance with some embodiments. In some embodiments, the semiconductor material layer 320 includes silicon or another elementary semiconductor material such as germanium. In some other embodiments, the semiconductor material layer 320 includes a compound semiconductor. The compound semiconductor may include silicon germanium, gallium arsenide, silicon carbide, indium arsenide, indium phosphide, another suitable compound semiconductor, or a combination thereof. In some embodiments, the semiconductor material layer 320 and the semiconductor substrate 100 include different materials. For example, the semiconductor material layer 320 includes silicon germanium and the semiconductor substrate 100 includes silicon.

In some embodiments, a patterned mask layer is formed over the semiconductor substrate 100 to assist in the formation of the semiconductor material layer 320. The patterned mask layer has openings exposing portions of the semiconductor substrate 100 in the regions 100B. In some embodiments, the patterned mask layer is made of silicon oxide, silicon nitride, another suitable material, or a combination thereof.

Afterwards, one or more semiconductor materials are selectively deposited over the semiconductor substrate 100 in the regions 100B. As a result, the semiconductor material layer 320 is formed in each of the regions 100B. The patterned mask layer is subsequently removed. In some embodiments, the semiconductor material is deposited using a SEG process, a CVD process (e.g., a VPE process, a LPCVD process, and/or an UHV-CVD process), a molecular beam epitaxy process, another applicable process, or a combination thereof.

As shown in FIG. 3B, source structures 120" are formed in the semiconductor material layer 320 in the regions 100B, in accordance with some embodiments. In some embodiments, the source structures 120" are doped with one or more N-type or P-type dopants. In some embodiments, the dopants in the source structures 120' and 120" are different types.

In some embodiments, one or multiple implantation processes are performed over the semiconductor material layer 320 so as to form the source structures 120". In some embodiments, an implantation mask is used to ensure that the semiconductor material layer 320 in the regions 100B is doped to form the source structures 120" while the semiconductor substrate 100 in the regions 100A is not doped. For example, the implantation mask has openings exposing portions of the regions 100B without exposing the regions 100A. The materials and/or formation methods of the source structures 120" are the same as or similar to that of the source structures 120.

Figure 3C:
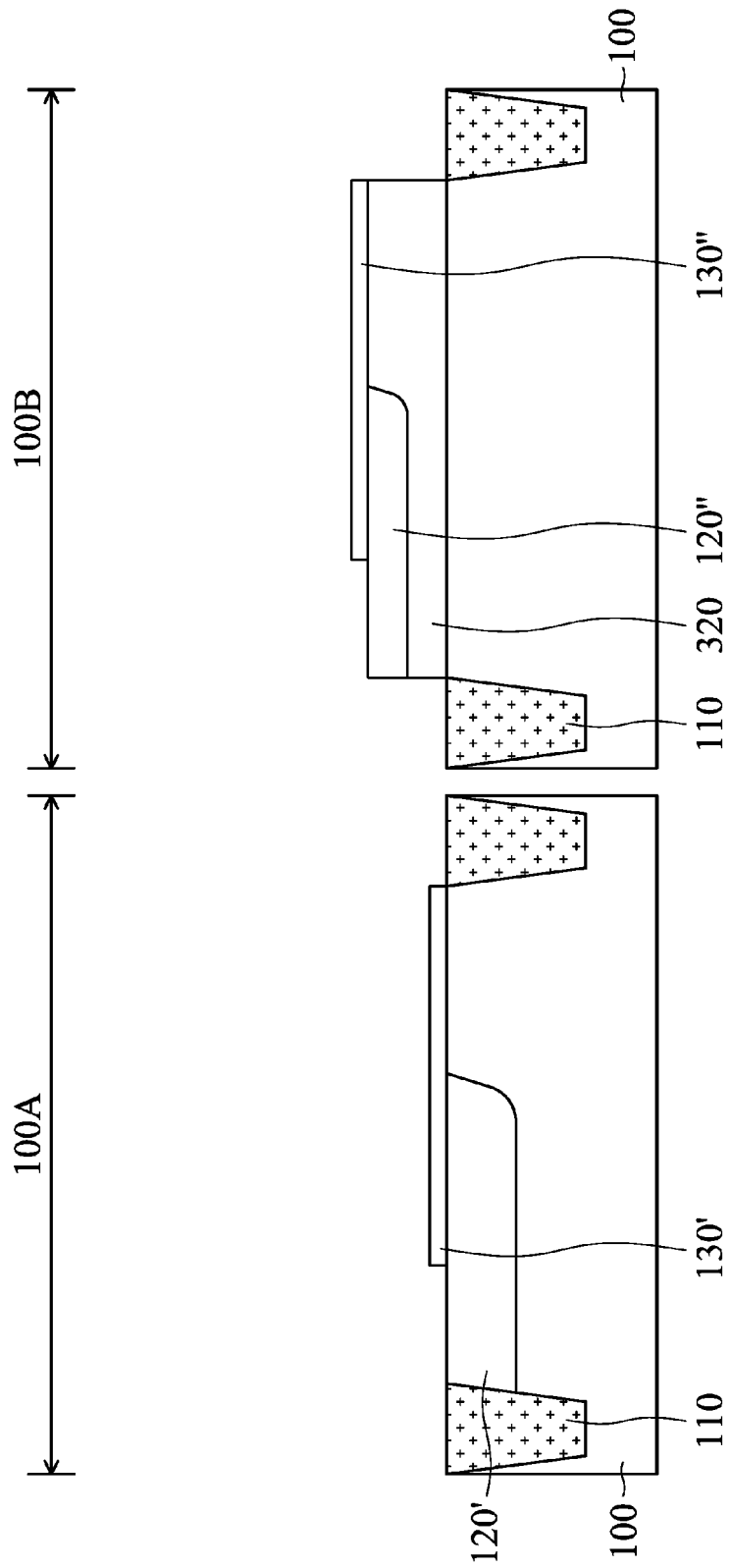

As shown in FIG. 3C, similar to the embodiments illustrated in FIG. 1B, channel layers 130' and 130" are respectively formed in the regions 100A and 100B, in accordance with some embodiments. The channel layers 130' and 130" are respectively formed over the semiconductor substrate 100 and the semiconductor material layer 320. In some embodiments, the channel layers 130' and 130" include different materials suitable for the P-type TFET and the N-type TFET. For example, the channel layers 130' include silicon germanium and the channel layers 130" include silicon. In some other embodiments, the channel layers 130' and 130" include the same material. In some embodiments, the channel layers 130' and 130" are formed in the same stage. In some other embodiments, the channel layers 130' and 130" are formed in different stages.

Figure 3D:
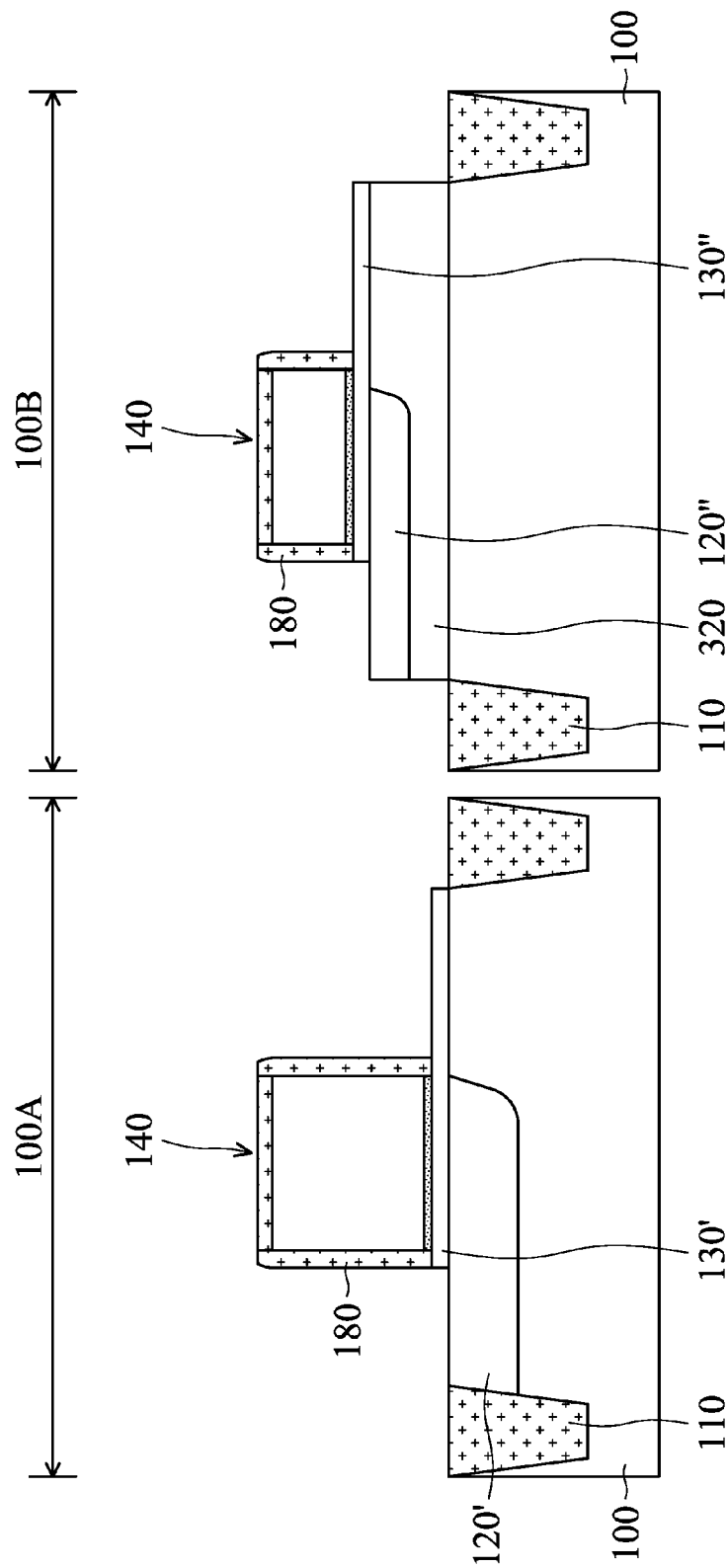

As shown in FIG. 3D, similar to the embodiments illustrated in FIG. 1C, gate stacks 140 are formed over the channel layers 130' and 130" in the regions 100A and 100B, in accordance with some embodiments. Subsequently, similar to the embodiments illustrated in FIG. 1C, spacer elements 180 are formed over sidewalls of the gate stacks 140.

In some embodiments, the gate stacks 140 in the regions 100A and 100B have different heights. For example, the gate stacks 140 in the regions 100A are taller than the gate stacks 140 in the regions 100B. In some other embodiments, the gate stacks 140 in the regions 100A and 100B have the same height. In some embodiments, the gate stacks 140 in the regions 100A and 100B are formed in the same stage. In some other embodiments, the gate stacks 140 in the regions 100A and 100B are formed in different stages.

Figure 3E:
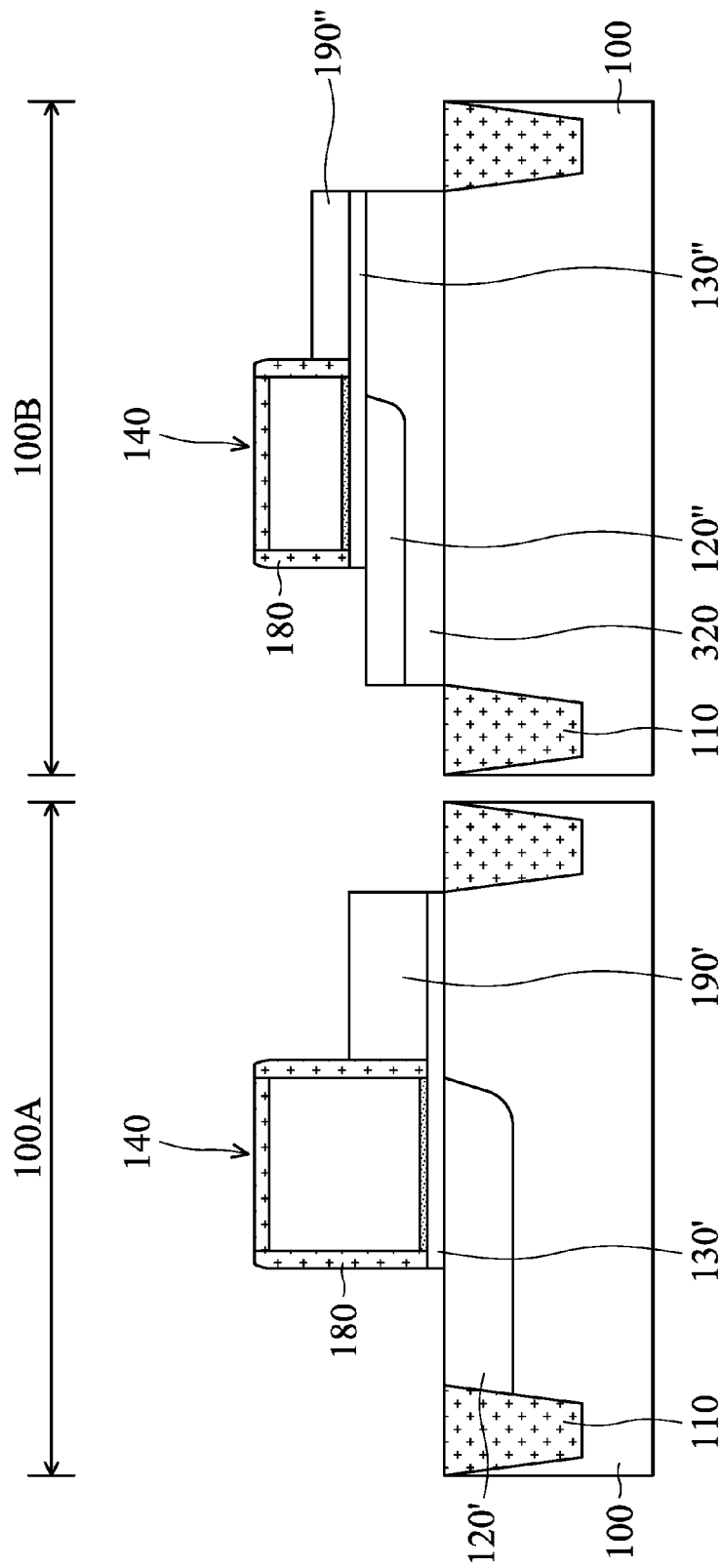

As shown in FIG. 3E, similar to the embodiments illustrated in FIG. 1D, drain structures 190' and 190" are respectively formed over the channel layers 130' and the channel layers 130", in accordance with some embodiments. In some embodiments, each of the drain structures 190' and 190" is doped with one or more N-type or P-type dopants. In some embodiments, the dopants in the drain structures 190' and 190" are different types. In some embodiments, the dopants in the drain structures 190' and the source structures 120' are different types. In some embodiments, the dopants in the drain structures 190" and the source structures 120" are different types.

In some embodiments, the drain structures 190' and 190" include different materials suitable for the P-type TFET and the N-type TFET. For example, the drain structures 190' include silicon germanium and the drain structures 190" include silicon. In some other embodiments, the drain structures 190' and 190" include the same material. In some embodiments, the drain structures 190' and 190" are formed in the same stage. In some other embodiments, the drain structures 190' and 190" are formed in different stages.

Figure 3F:
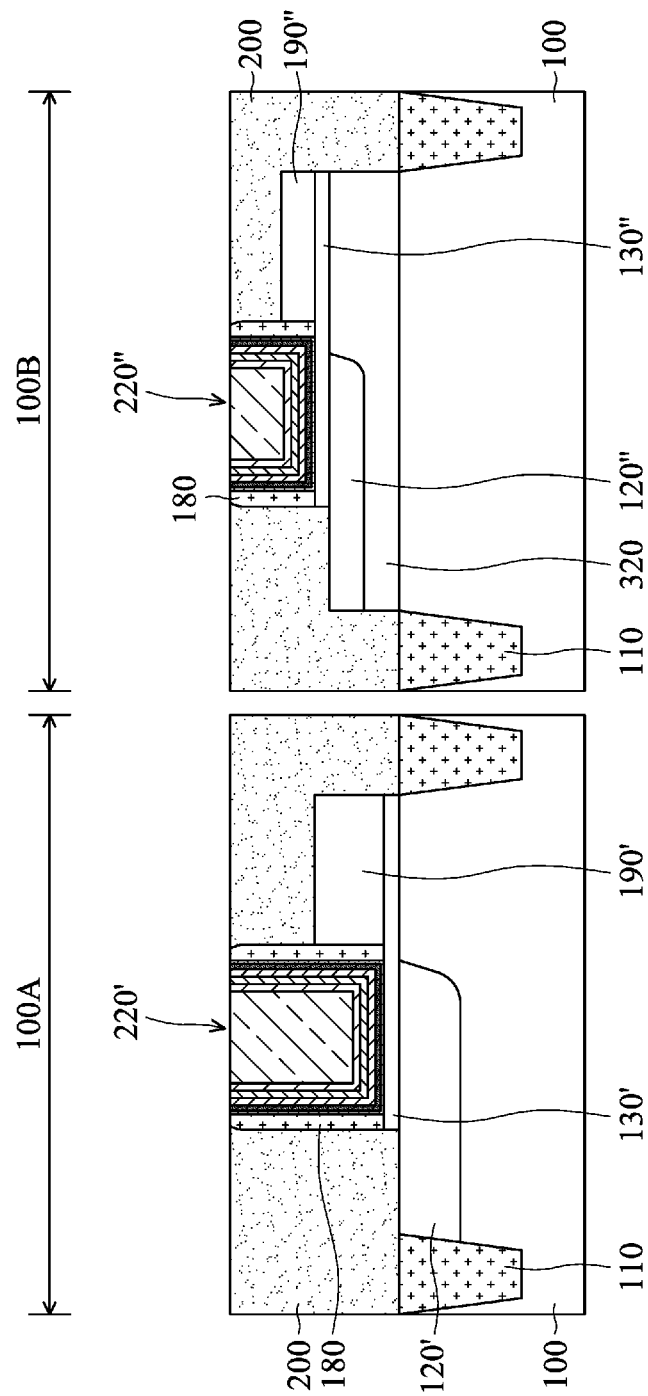

As shown in FIG. 3F, similar to the embodiments illustrated in FIG. 1E, a dielectric layer 200 is deposited over the semiconductor substrate 100 in the regions 100A and 100B, in accordance with some embodiments. Afterwards, similar to the embodiments illustrated in FIG. 1F, the gate stacks 140 in the regions 100A and 100B may be respectively replaced with gate stacks 220' and 220". In some embodiments, the thickness and/or the composition of the work function layers of the gate stacks 220' and 220" are separately fine-tuned to adjust the work function level suitable for the P-type TFET and the N-type TFET. For example, the work function layers of the gate stacks 220' and 220" may be metal layers with different types and may be formed in different stages.

Figure 3G:
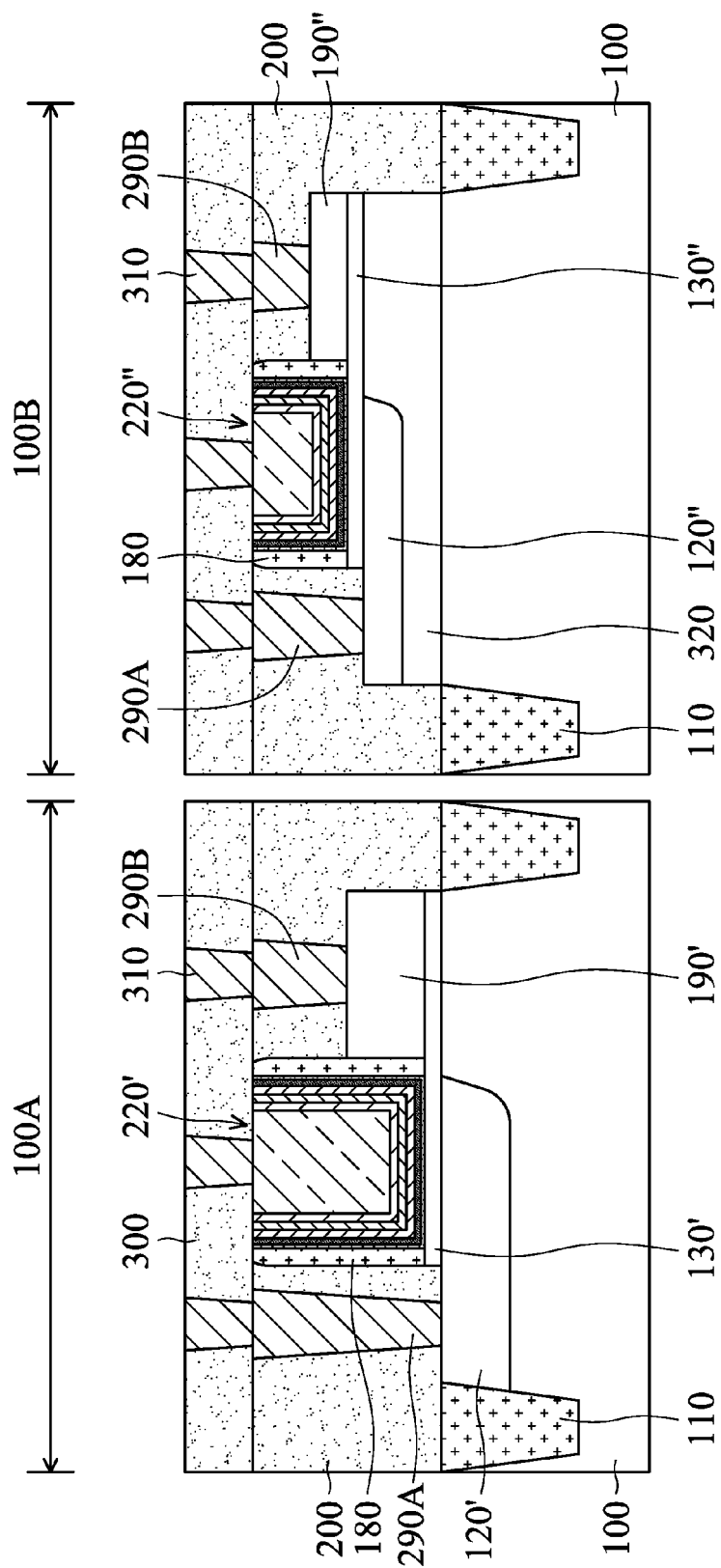

Similar to the embodiments illustrated in FIG. 1G, conductive contacts 290A and 290B are formed in the dielectric layer 200 in the regions 100A and 100B, as shown in FIG. 3G in accordance with some embodiments. In some embodiments, the conductive contacts 290A and 290B are respectively electrically connected to the source structures 120' and 120" and the drain structures 190' and 190". In some embodiments, the conductive contacts 290A in the regions 100A and 100B have different heights. In some embodiments, the conductive contacts 290B in the regions 100A and 100B have different heights. Afterwards, similar to the embodiments illustrated in FIG. 1G, a dielectric layer 300 and conductive contacts 310 are formed over the dielectric layer 200 in the regions 100A and 100B, as shown in FIG. 3G in accordance with some embodiments.

Embodiments of the disclosure form a semiconductor device structure with a TFET. The TFET includes an extended source structure, a raised channel layer, and a raised drain structure. The source structure extends below the raised channel layer and a gate stack over the raised channel layer so that the overlapping area between the source structure and the gate stack is increased. As a result, $I_{on}$ of the TFET is significantly enhanced. The raised drain structure is far away from the extended source structure. Therefore, current leakage between the source and drain structures is reduced or mitigated. Furthermore, a channel barrier is built due to spacer elements between the raised drain structure and the gate stack. As a result, $C_{gd}$ of the TFET is greatly reduced or eliminated, and source-to-drain leakage current can be prevented. Therefore, the device performance and reliability of the TFET is significantly improved.

In accordance with some embodiments, a semiconductor device structure is provided. The semiconductor device structure includes a source structure in a semiconductor substrate. The semiconductor device structure also includes a channel layer over the semiconductor substrate. A first portion of the channel layer covers a portion of the source structure. A second portion of the channel layer laterally extends away from the source structure. The semiconductor device structure further includes a drain structure over the semiconductor substrate. The drain structure and the source structure have different conductivity types. The drain structure adjoins the second portion of the channel layer.

In accordance with some embodiments, a semiconductor device structure is provided. The semiconductor device structure includes a source structure in a semiconductor substrate. The semiconductor device structure also includes a drain structure over the semiconductor substrate. The drain structure and the source structure have different conductivity types. The semiconductor device structure further includes a gate stack over the source structure. In addition, the semiconductor device structure includes a channel layer between the source structure and the gate stack. A portion of the channel layer laterally extends away from the gate stack to adjoin the drain structure.

In accordance with some embodiments, a method for forming a semiconductor device structure is provided. The method includes forming a source structure in a semiconductor substrate. The method also includes forming a channel layer covering the semiconductor substrate and a portion of the source structure. The method further includes forming a drain structure over the semiconductor substrate and adjoining the channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a source structure in a semiconductor substrate;
a channel layer over the semiconductor substrate, wherein a first portion of the channel layer covers a portion of the source structure, and a second portion of the channel layer laterally extends away from the source structure; and
a drain structure over the semiconductor substrate, wherein the drain structure and the source structure have different conductivity types, and wherein the drain structure adjoins the second portion of the channel layer.

2. The semiconductor device structure as claimed in claim 1, wherein the second portion of the channel layer is between the drain structure and the semiconductor substrate.

3. The semiconductor device structure as claimed in claim 1, wherein the drain structure adjoins a sidewall of the second portion of the channel layer.

4. The semiconductor device structure as claimed in claim 1, further comprising a gate stack over the semiconductor substrate, wherein the first portion of the channel layer is between the gate stack and the source structure.

5. The semiconductor device structure as claimed in claim 4, wherein the second portion of the channel layer is between the gate stack and the semiconductor substrate.

6. The semiconductor device structure as claimed in claim 4, wherein the bottom surface of the gate stack is below a top surface of the drain structure.

7. The semiconductor device structure as claimed in claim 4, further comprising spacer elements over sidewalls of the gate stack, wherein one of the spacer elements vertically overlaps the channel layer.

8. The semiconductor device structure as claimed in claim 4, further comprising spacer elements over sidewalls of the gate stack, wherein one of the spacer elements is between the gate stack and the drain structure.

9. A semiconductor device structure, comprising:
   a source structure in a semiconductor substrate;
   a drain structure over the semiconductor substrate, wherein the drain structure and the source structure have different conductivity types;
   a gate stack over the source structure; and
   a channel layer between the source structure and the gate stack, wherein a portion of the channel layer laterally extends away from the gate stack to adjoin the drain structure.

10. The semiconductor device structure as claimed in claim 9, wherein the portion of the channel layer adjoins a bottom surface of the drain structure.

11. The semiconductor device structure as claimed in claim 9, wherein the portion of the channel layer adjoins a sidewall of the drain structure.

12. The semiconductor device structure as claimed in claim 9, wherein the source structure extends across a sidewall of the gate stack towards another sidewall of the gate stack.

13. The semiconductor device structure as claimed in claim 9, wherein a bottom surface of the drain structure is over a top surface of the source structure.

14. The semiconductor device structure as claimed in claim 9, further comprising spacer elements over sidewalls of the gate stack, wherein one of the spacer elements is between the gate stack and the drain structure.

15. The semiconductor device structure as claimed in claim 9, further comprising a conductive contact over the drain structure, wherein a portion of the drain structure is sandwiched between the conductive contact and the channel layer.

16. A method for forming a semiconductor device structure, comprising:
   forming a source structure in a semiconductor substrate;
   forming a channel layer covering the semiconductor substrate and a portion of the source structure; and
   forming a drain structure over the semiconductor substrate and adjoining the channel layer.

17. The method for forming a semiconductor device structure as claimed in claim 16, wherein the formation of the drain structure comprises epitaxially growing a semiconductor material on the channel layer.

18. The method for forming a semiconductor device structure as claimed in claim 16, wherein the formation of the channel layer comprises epitaxially growing a semiconductor material on the semiconductor substrate and the source structure.

19. The method for forming a semiconductor device structure as claimed in claim 18, further comprising forming spacer elements over sidewalls of the gate stack before the formation of the drain structure.

20. The method for forming a semiconductor device structure as claimed in claim 16, further comprising forming a gate stack over the channel layer before the formation of the drain structure.

* * * * *